(12) United States Patent  (10) Patent No.: US 7,992,113 B1
Goldberg  (45) Date of Patent: Aug. 2, 2011

(54) METHODS AND APPARATUS FOR DECISION MAKING IN RESOLUTION BASED SAT-SOLVERS

(75) Inventor: Eugene Goldberg, El Cerrito, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 581 days.

(21) Appl. No.: 12/118,136

(22) Filed: May 9, 2008

(51) Int. Cl.
*G06F 17/50* (2006.01)
(52) U.S. Cl. ........................ 716/106; 716/107
(58) Field of Classification Search .................. 716/4, 5, 716/106, 107; 702/22; 703/2, 13, 22; 706/2, 706/19, 45
See application file for complete search history.

(56) References Cited

U.S. PATENT DOCUMENTS 7,356,519 B1* 4/2008 Goldberg et al. ............... 706/45
2007/0299648 A1* 12/2007 Levitt et al. ..................... 703/22

OTHER PUBLICATIONS

Biere, A.Cimatti, E.Clarke, O.Strichman, Y.Zhu. "Bounded Model Checking", Advances in computers vol. 58, ed. by M. Zelkovitz, Elsevier, 2003.
Een et al, "An extensible SAT-solver", Proceedings of SAT-2003 in LNCS 2919, pp. 503-518.
Fang et al, "Complete Local Search for Propositional Satisfiability", Proc. of 19th National Conference on Artificial Intelligence, 2004, pp. 161-166.
Gelder, "Autarky pruning in propositional model elimination reduces failure redundancy", J. of Autom. Reasoning,1999, vol. 23(2),pp. 137-193.
Goldberg, "Determinization of resolution by an algorithm operating on complete assignments", SAT-2006, LNCS 4121, pp. 90-95.
Goldberg et al, "BerkMin: a Fast and Robust SAT-Solver", Date-2002, Paris, pp. 142-149.
Gomes et al, "Boosting Combinatorial Search Through Randomization", Proc. AAAI-98.
Habet et al, "A hybrid approach for SAT", Int. Conf. on Principles and Practice of Constraint Programming, 2002, pp. 172-184.
Hirsch et al, "UnitWalk: A new SAT solver that uses local search guided by unit clause elimination",Annals of Math. and Artif. Intell. 43(1-4), pp. 91-111, 2005.
Katz et al, "Space-efficient Bounded Model Checking", Date-2005, pp. 686-687.
Kullmann, "Investigations on autark assignments", Discrete Applied Mathematics 2000, vol. 107, pp. 99-137.
Li, "A constrained-based approach to narrow search trees for satisfiability", Information processing letters, 1999, 71, pp. 75-80.

(Continued)

*Primary Examiner* — Vuthe Siek
(74) *Attorney, Agent, or Firm* — Kilpatrick Townsend & Stockton LLP (57) ABSTRACT

An apparatus and methods for the production of satisfiability reports are provided. In an exemplary embodiment, a method of producing a report is provided. The method includes generating a complete assignment for a CNF formula, deriving first second sets of clauses that are unsatisfied by the reference point, making decision assignments, performing BCP then recomputing the second set of clauses. One feature of this embodiment is that it provides for efficient solutions for SAT problems. Other embodiments provide apparatus and software products that implement the disclosed methods. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

21 Claims, 5 Drawing Sheets

OTHER PUBLICATIONS

Moskewicz et al, "Chaff: Engineering an Efficient SAT Solver", DAC-2001.
Prasad et al, "A survey of recent advances in SAT-based formal verification", STTT vol. 7(2), pp. 16-173, 2005.
Prestwich, "Local search and backtracking vs. non-systematic backtracking", AAAI Fall Symposium on Using Uncertainty Within Computation. Nov. 2-4, 2001, North Falmouth, Cape Cod, MA, pp. 109-115.
Selman et al, "A New Method for Solving Hard Satisfiability Problems", AAAI-92, pp. 440-446.
Selman et al, "Noise strategies for improving local search", AAAI-94, Seattle, pp. 337-343, 1994.
Silva et al, "GRASP: A Search Algorithm for Propositional Satisfiability", IEEE Transactions of Computers, 1999, vol. 48, pp. 506-521.
Zhang et al, "Efficient Conflict Driven Learning in a Boolean Satisfiability Solver", ICCAD-2001.
Zhang, "SATO: An efficient propositional prover", International Conference on Automated Deduction, Jul. 1997, pp. 272-275.

* cited by examiner

METHODS AND APPARATUS FOR DECISION MAKING IN RESOLUTION BASED SAT-SOLVERS

FIELD OF THE INVENTION

The present invention generally relates to integrated circuits. More particularly, the invention concerns methods and apparatus for decision making in verification of integrated circuit designs.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs must be highly functional, low cost and have low power consumption. These demands create increased complexity on the design, verification, and manufacture of ICs.

A typical IC design may involve the creation of electronic components, such as transistors and resistors, and the interconnections of these components onto a substrate, such as silicon. The simulation, verification, and sometimes layout of these components usually is accomplished in sub-blocks, or modules. Each block may be simulated and verified individually. Multiple design teams typically work on the individual blocks. During the design process functional verification is critical.

Functional verification involves the verification that the design conforms to the specification. It additionally may involve the validation that a design meets the desired functionality. Part of the process of verification includes the creation of Register Transfer Level (RTL) digital designs that describe in detail the functionality of the device or block at every cycle of the clock. Creation and verification RTL design may be one of the more difficult portions of the design process. In many instances, this verification is a very difficult and time intensive task. Simulation tools are typically used to assist in verification. In most designs, simulation-based functional verification is performed on multiple machines in parallel. The process is processor and memory intensive and presents significant difficulties and expenses in the design process.

The satisfiability problem (SAT) is ubiquitous in EDA applications. It is used in equivalence checking, logic synthesis, test generation, model checking to name a few. There are a number of computer aided techniques that are typically used to verify the functionality of digital designs. For example, model checking is a widely used formal verification technique that may be implemented with Binary Decision Diagrams (BDD). As is known in the art, BDDs are data structures used to represent Boolean functions. With recent advances in tools to solve the Boolean satisfiability problem (SAT), SAT solvers are proving to be an effective alternative to BDD's. A given Boolean formula is considered satisfiable if all the variables in the formula can take on such values to make the formula evaluate to true. Alternatively, and potentially more important, if no combination of values can be found that forces the function to evaluate to true, then the formula is unsatisfiable. With complex digital designs, verification approaches can be significantly complex and the memory limits of a computer can be quickly reached.

The most successful SAT-solvers are based on the Davis Putnam Logemann Loveland (DPLL) procedure. In turn, this procedure is based on branching on the values of variables of the CNF formula F to be solved. The process of picking the next assignment of a variable of F is called decision-making. Efficient and effective decision-making is very important for the success of SAT-solvers based on the DPLL procedure. Currently, SAT-solvers use variations of conflict driven decision making introduced by the SAT-solver Chaff.

The general DPLL procedure involves three basic parts, decide, deduce, and analyze conflict. In the decision phase, assignments are made to literals of a CNF formula. In the deduce phase, also referred to as Boolean Constraint Propagation (BCP), clauses are evaluated based on the assignments made. If conflicts are found they are reported. When a unit clause is identified, the unit literal is forced to true. If there is an earlier assignment to this variable, an intersection of the variable value set and the unit literal value set provides the final implication assignment. If no further implications can be derived deduce reports success. The analyze conflict phase identifies the assignments causing conflict and adds a clause to the formula which represents an abstraction of unsatisfiable parts of the solution space. The added clause is referred to as a conflict-induced clause, or a learned clause. The process of constructing the learned clauses is known as conflict-based learning. A conflict is resolved by backtracking. Backtracking undoes all recent assignments up to the most recent decision responsible for the conflict. In many cases not all decisions made so far are responsible for the conflict. In these cases it is possible to backtrack beyond one decision level. This is referred to as non-chronological backtracking. If the conflict cannot be resolved, i.e., all decision assignments will cause a conflict, analyze conflict reports failure.

Resolution based SAT-solvers have gained great popularity due to their ability to solve very large practical CNF formulas. An important contributor to this success is conflict driven decision making (CDDM) introduced initially in "*Chaff: Engineering an Efficient SAT Solver*", M. Moskewicz, C. Madigan, Y Zhou, L. Zhang, S. Malik, DAC-2001. A number of others have provided advancements in this space including "BerkMin: a Fast and Robust SAT-Solver", E. Goldberg, DATE-2002, Paris, pp-142-149; "An Extensible SAT-solver." E. Sorensson, Proceedings of SAT-2003 in LNCS 2919, pp 503-518. CDDM takes into account the history of conflicts thus forcing the SAT-solver to explore parts of the search space that have not been visited before. Despite the obvious success of CDDM, still there are many directions to explore.

Currently there are two approaches to SAT-solving. One approach is local search algorithms. These algorithms operate on complete assignments and are usually applicable only to satisfiable formulas. The advantage of a local search algorithm is that it 'knows' exactly what clauses of the formula are left falsified (i.e. unsatisfied). To reach a satisfying assignment a local search algorithm flips values of variables trying to get a new complete assignment that falsifies fewer clauses.

Another approach is SAT-solvers based on the DPLL procedure. A DPLL-based SAT-solver maintains a partial assignment trying to extend it (one variable assignment at a time) to satisfy all the clauses. If a clause, become unsatisfiable, such a SAT-solver backtracks and changes some variable assignment. A DPLL-based SAT-solvers can be used for both satisfiable and unsatisfiable formulas. The advantage of these SAT-solvers is that they employ Boolean Constraint Propagation (BCP) and clause learning. BCP is used to make 'forced' assignments (if an unsatisfied clause has only one literal left unassigned, there is only one way to satisfy this clause). Clause learning allows DPLL-based SAT-solvers to introduce new implications that make BCP more powerful.

The main flaw of local search algorithms is that they do not work well on structured formulas (for example, formulas that describe circuits). The reason is that these algorithms do not use BCP and learning.

The drawbacks of DPLL-based SAT-solvers are as follows. Since these SAT-solvers maintain only a partial assignment they do not 'know' how many clauses of the formula are currently falsified. So such a SAT-solver can get very close to a satisfying assignment not being able to benefit from this proximity. The fact that a DPLL-based SAT-solver maintains only a partial assignment also deteriorates this SAT-solver's decision making for unsatisfiable formulas. If for example, a CNF formula has a small unsatisfiable subformula, a DPLL based SAT-solver may never 'reach' this subformula.

Another method combines local search and a DPLL-based procedure. This method, "FI" maintains a partial and a complete assignment. The idea of FI is to reduce branching choices to the variables of clauses that are falsified by the current complete assignment. FI maintains a complete and partial assignments, which mitigates the problems that DPLL-based SAT-solvers have. Nevertheless, FI still has the following flaws. Since FI maintains a complete assignment it knows what clauses of the formula are currently falsified. However, it has no ability to reduce the number of falsified clauses as it is done by local search algorithms.

As far as unsatisfiable formulas are concerned, FI has the following drawback. Suppose that the formula F to be solved contains a small unsatisfiable subformula F'. No matter how one picks a complete assignment, a clause of F' is falsified by this assignment. FI maintains a complete assignment w and limits the choice of next branching variable only to the variables of clauses falsified by w. So a variable of F' will be always available to FI for branching. Ideally, one would like w to falsify only clauses of F' (branching in variables of F' leads to quick solving the formula F). However, in reality, w falsifies a lot of clauses of F that are not in F'. This reduces the chances of FI to pick a variable of F' for branching.

Therefore there exists a need for a system, and methods for improved SAT-solvers.

SUMMARY OF THE INVENTION

The present invention provides a system, apparatus and methods for overcoming some of the difficulties presented above. Embodiments provide a new decision-making procedure called Decision Making with a Reference Point (DMRP). As used herein, a reference point is a complete assignment used by a SAT-solver employing DMRP (herein referred to as DMRP-SAT). One advantage of DMRP is that it allows a DPLL-based SAT-solver to pursue the 'local search strategy' of reducing the set of clauses falsified by the current reference point. For satisfiable formulas, DMRP-SAT usually finds satisfying assignments faster than SAT-solvers based on conflict driven decision making. For unsatisfiable formulas, DMRP-SAT has fewer backtracks and so can generate shorter proofs of unsatisfiability.

In an exemplary embodiment, a method is disclosed that produces a verification report initially by converting a design problem into a conjunctive normal form formula to be solved. The method generates a reference point from the design problem where the reference point includes an assignment of values to all variables in the conjunctive normal form formula. The provided method then derives a first set of clauses from the formula which contains the clauses that are falsified by the reference point. The provided method then forms a second set of clauses from the first set, where the second set of clauses initially equal to a non-empty subset of clauses falsified by the reference point. A decision assignment is then made satisfying at least one clause of the set. Boolean Constraint Propagation is performed by making a plurality of implied assignments, each implied assignment satisfying a yet unsatisfied clause having only one unassigned literal. The second set of clauses is then recomputed based on each decision and implied assignment. In this exemplary method the recomputation removes every clause from the second assignment that is satisfied by the assignment and adds clauses that become unsatisfied where the added clauses have a literal falsified by the new assignment and the new assignment disagrees with the reference point. A new reference point is obtained from the previous reference point by flipping all the assignments of the previous reference point that disagree with new assignments. The method then reports satisfiability if the new reference point satisfies all the clauses.

Other embodiments provide a computing apparatus and computer software products. The exemplary computing apparatus contains a processor, memory, and a storage medium. Contained on the storage medium are a set of processor executable instructions that, when executed by the processor configure the computing apparatus to provide verification of satisfiability of a design problem, by the methods described herein. In an exemplary computer software product embodiment, a computer readable medium is provided. The computer readable medium contains a set of processor executable instructions that, when executed by a processor, configure a computing apparatus to provide verification of satisfiability of a design problem, by the methods described herein One feature of this embodiment is that it provides a verification of a digital design description, where other methods may fail due to memory constraints of a computing device. One advantage of provided embodiments is that they allow a DPLL-based SAT-solver to pursue the 'local search strategy' of reducing the set of clauses falsified by the current reference point. For satisfiable formulas, DMRP-SAT usually finds satisfying assignments faster than SAT-solvers based on conflict driven decision making. For unsatisfiable formulas, DMRP-SAT has fewer backtracks and so can generate shorter proofs of unsatisfiability.

These and other features and advantages of the present invention will be appreciated from review of the following detailed description of the invention, along with the accompanying figures in which like reference numerals refer to like parts throughout.

BRIEF DESCRIPTION OF THE DRAWINGS

Various embodiments of the present invention taught herein are illustrated by way of example, and not by way of limitation, in the figures of the accompanying drawings, in which.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

As is known in the art, the Boolean satisfiability problem (SAT) is a problem that seeks to determine if the variables of a given Boolean formula can be assigned in a way as to make the formula evaluate to 1 or "true". If the set of inputs can be so assigned the formula is "satisfiable". On the other hand if no such assignment exists this implies that the formula is identically equal to 0 or "false" for all possible inputs. In this case the formula is considered "unsatisfiable". Most SAT solvers require the formula under verification to be expressed in conjunctive normal form (CNF) as a conjunction of clauses which is a disjunction of variables or their negations. For example, the CNF formula (a OR b) AND (NOT b OR c) is satisfiable if a=0, b=1 and c=1.

The satisfiability problem (SAT) is ubiquitous in EDA applications. It is used in equivalence checking, logic synthesis, test generation, model checking and so on. The most successful SAT-solvers are based on so-called DPLL procedure (described above). In turn, this procedure is based on branching on the values of variables of the CNF formula F to be solved. The process of picking the next assignment of a variable of F is called decision-making. Efficient and effective decision-making is very important for the success of SAT-solvers based on the DPLL procedure. Currently, SAT-solvers use variations of conflict driven decision making introduced by the SAT-solver Chaff. Embodiments provide a new decision-making procedure called Decision Making with a Reference Point (DMRP). A reference point as used herein is a complete assignment used by a SAT-solver employing DMRP (we will refer to this SAT-solver as DMRP-SAT). One feature of various embodiments is that they allow a DPLL-based SAT-solver to pursue the 'local search strategy' of reducing the set of clauses falsified by the current reference point. For satisfiable formulas, DMRP-SAT usually finds satisfying assignments faster than SAT-solvers based on conflict driven decision making. For unsatisfiable formulas, DMRP-SAT has fewer backtracks and so can generate shorter proofs of unsatisfiability.

Like FI, DMRP-SAT maintains a complete assignment called a reference point and partial assignment. An important distinction of DMRP-SAT is its decision-making is aimed at recursively satisfying a clause that is falsified by the current reference point. This allows DMPR-SAT to combine a DPLL-like procedure and the local search strategy of reducing the set of clauses falsified by the current complete assignment.

One advantage of embodiments of DMRP-SAT over local search algorithms is that the former uses BCP and clause learning (this makes DMRP-SAT much more powerful). One advantage of embodiments of DMRP-SAT over DPLL-like SAT-solvers maintaining a partial assignment is twofold. For satisfiable formulas, DMRP-SAT maintains a complete assignment and so it knows which clauses are currently falsified. So provided embodiments of DMRP-SAT can report that a satisfying assignment is found as soon as the set of clauses falsified by the current reference point is empty. When this happens, the partial assignment maintained by DMRP-SAT may satisfy only a small fraction of clauses. On the contrary, a DPLL-like SAT-solver reports that a formula is satisfiable only when the partial assignment it maintains satisfies all clauses.

As far as unsatisfiable formulas are concerned, one advantage of DMRP-SAT is that it has the greater probability of branching on 'core' variables. If a formula F has an unsatisfiable subformula F, a reference point will falsify at least one clause of F'. DMRP-SAT tries to recursively satisfy a clause falsified by the reference point. So there is a good chance that DMRP-SAT will pick a clause of F'.

One advantage of DMRP-SAT over FI is as follows. In contrast to FI, DMRP-SAT uses decision-making aimed at reducing the number of falsified clauses. So DMRP-SAT not only 'knows' which clauses are falsified by the current complete assignment (reference point) but it can also reduce this number. This fact is important for finding satisfying assignment faster. The strategy of reducing the set of clauses falsified by the current complete assignment is also beneficial for unsatisfiable formulas. The fewer clauses is falsified by the current reference point, the more likely it is that when looking for a clause to be satisfied recursively, DMRP-SAT will pick a clause of a small unsatisfiable subformula.

Figure 1:
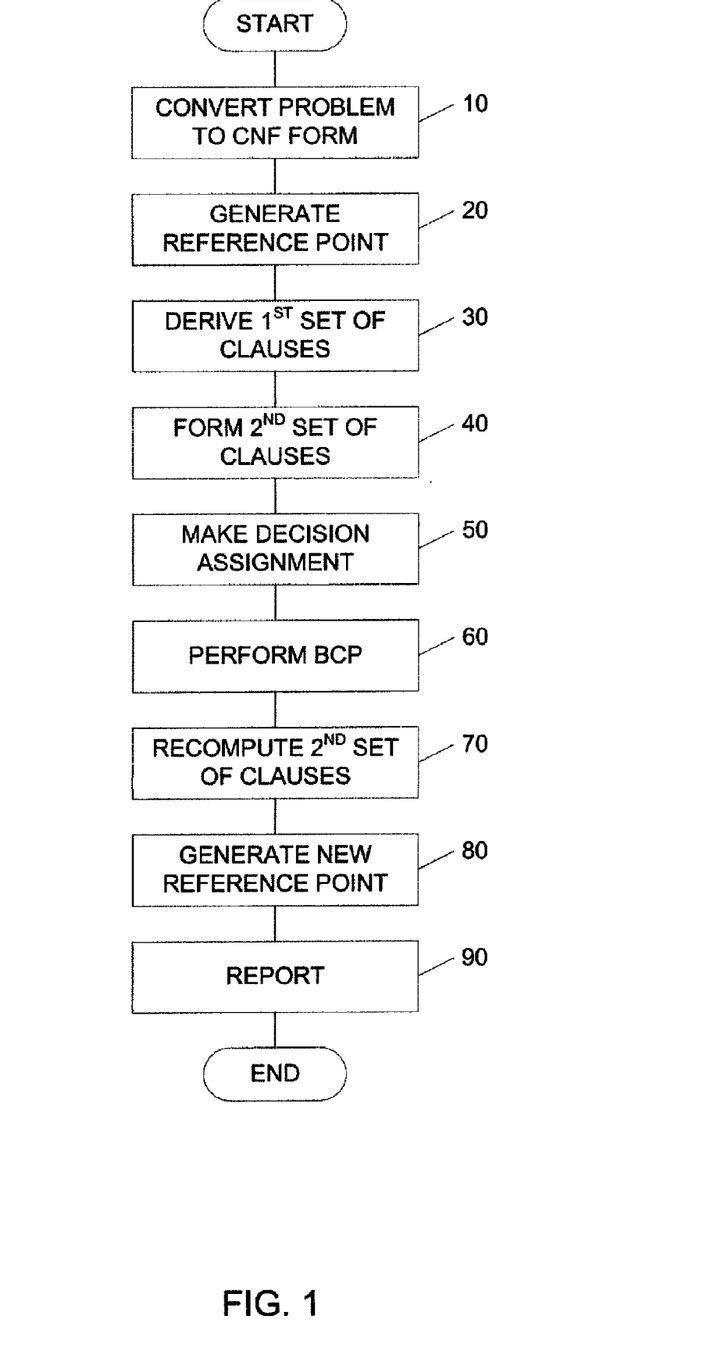
FIG. 1 illustrates an exemplary provided method.

FIG. 1 illustrates an exemplary provided embodiment of a method of producing a satisfiability report. In this method, flow begins in block 10 where a design problem is converted into a formula in CNF. As is known in the art, CNF is a conjunction of clauses which is a disjunction of variables or their negations. Flow continues to block 20, where a reference point is generated. A reference point, as used herein is a complete assignment of values to all variables in the formula to be satisfied. Flow continues to block 30 where a first set of clauses is derived from the formula. This first set of clauses includes the clauses falsified by the assignments in the reference point. Flow then continues to block 40 where a second set of clauses is derived from the first. In an exemplary embodiment, this second set of clauses is a non-empty subset of clauses falsified by the reference point. Flow continues to block 50 where a decision assignment satisfying at least one clause in the second set. Flow continues to block 60 where Boolean Constraint Propagation is performed by making a plurality of implied assignments. In an exemplary embodiment each of these implied assignments satisfies at least one clause that was unsatisfied and each clause has only one literal unassigned. Flow then continues to block 70 where the second set of clauses is recomputed based on the decision assignments and the implied assignments. Flow continues to block 80 where a new reference point is generated for the formula. This new reference point is generated from the previous reference point by flipping all of the assignments that differ from the new decision and implied assignments. Flow continues to block 90 and a satisfiability report is generated if the new reference point satisfies all of the clauses in the formula.

Figure 2:
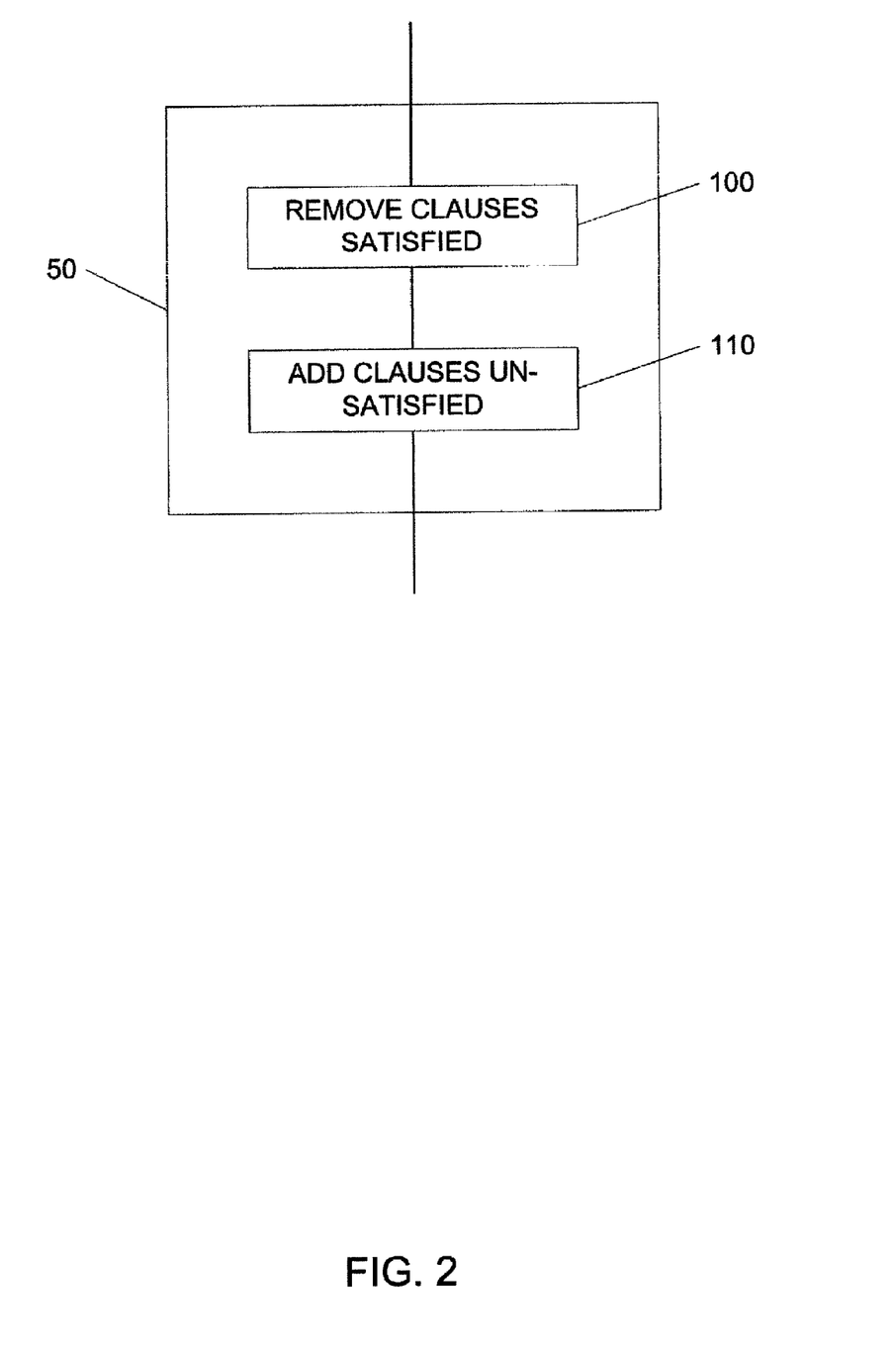
FIG. 2 illustrates another provided method.

FIG. 2 illustrates one embodiment of a method of recomputing the second set. In this embodiment, recomputing comprises removing clauses from the second set that were satisfied by the new assignment in block 100. Flow continues to block 110 where clauses are added to the second set, from the first set. The clauses added are clauses unsatisfied by the new assignment that have a literal falsified by the new assignment. The added clauses are further constrained to be clauses where this new assignment disagrees with the assignment in the reference point. In this manner, the second set of clauses is updated to contain unsatisfied clauses based on each new assignment.

Figure 3:
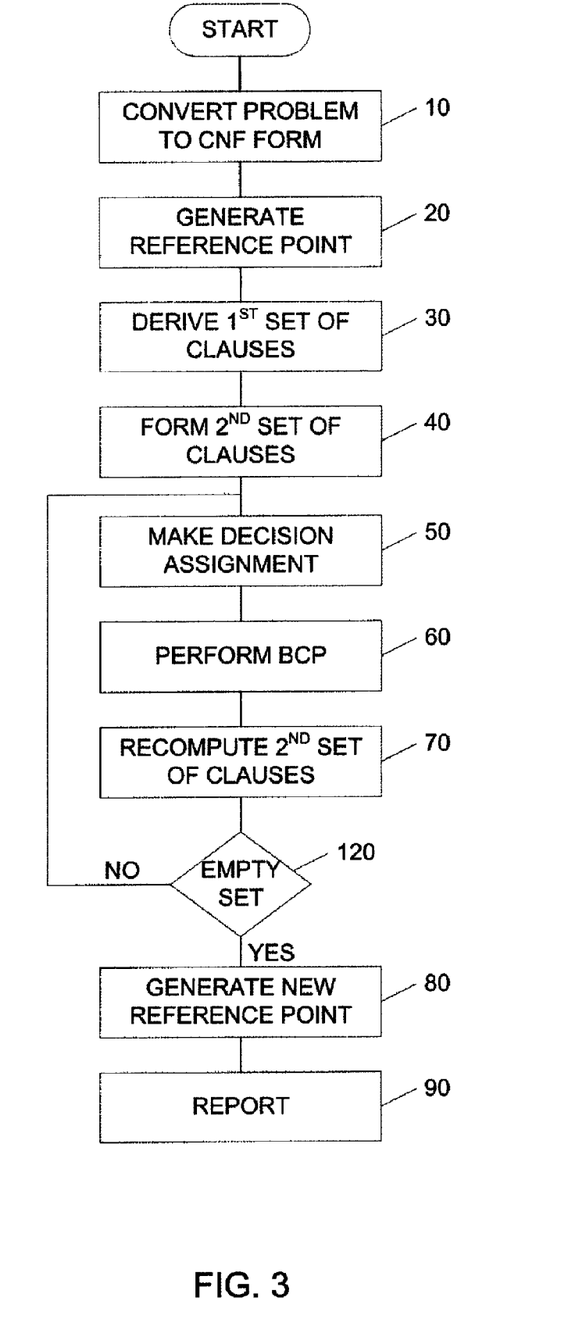
FIG. 3 illustrates a further provided method.

Another embodiment of a provided method is illustrated in FIG. 3. In this embodiment, like the previous embodiment the flow in blocks 10-70 are the same as the above embodiment. After recomputing the second set of clauses in block 70 flow continues to decision block 120 where it is determined if the second set of clauses is an empty set. If it is determined that the second set of clauses is an empty set in decision block 120 flow continues in a similar manner as described above to blocks 80 and 90. If in decision block 120 it is determined that the second set of clauses is not empty the flow continues back to block 50 where a new decision assignment is made. The method then iterates through blocks 50-70 until it is determined at decision block 120 that the second set f clauses is an empty set.

Figure 4:
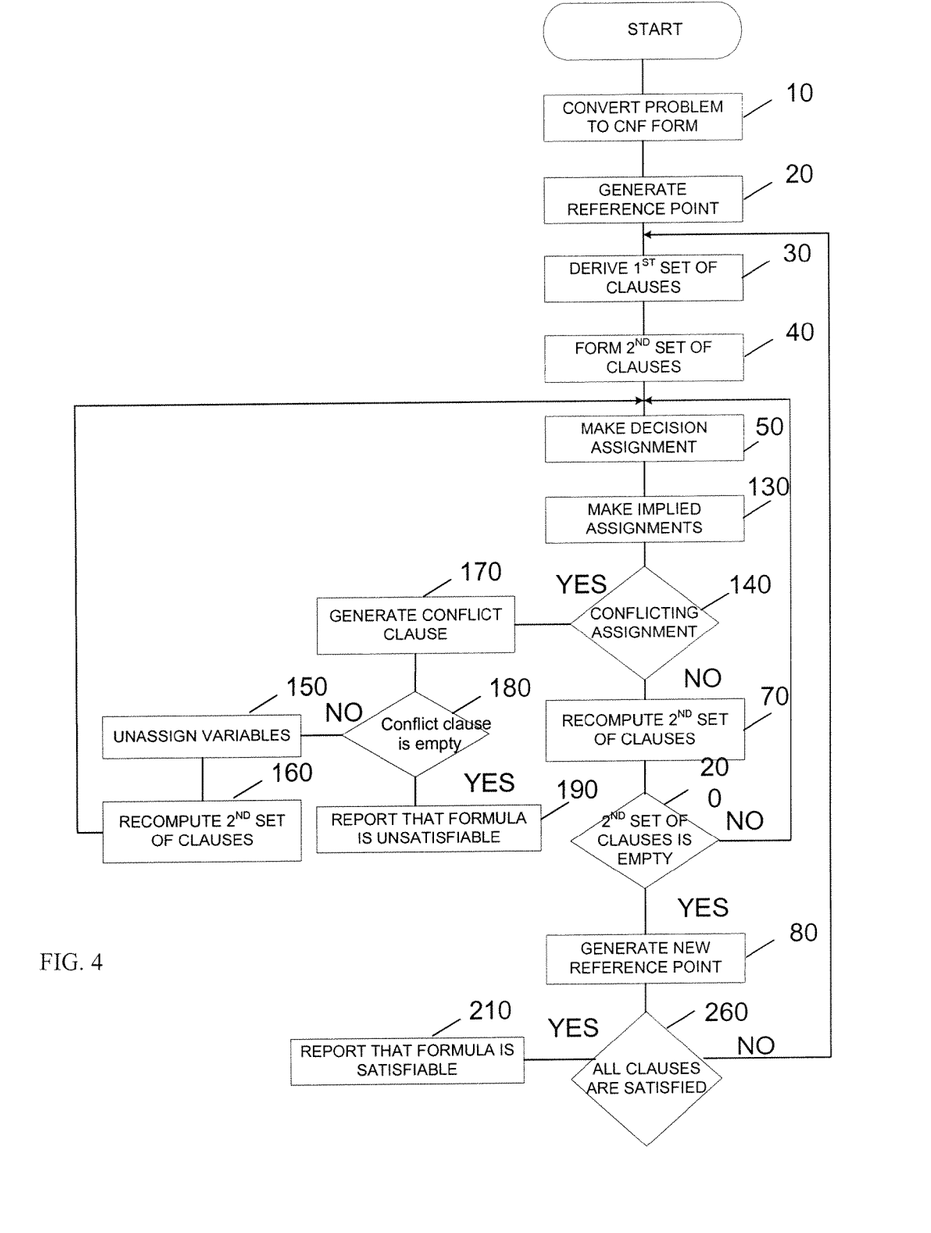
FIG. 4 illustrates a still further provided method.

A further exemplary embodiment of a method is illustrated in FIG. 4. In this embodiment the flow is similar to the above for blocks 10-50. Flow continues to block 130 where, like in other embodiments, implied assignments are made. Flow then continues to decision block 140. If it is determined in decision block 140 that no conflicting assignment has been made, flow continues to block 70 where the second set of clauses is recomputed. Flow then continues on to decision block 200 where it is determined if the second set of clauses is empty. When it is determined that the second set of clauses is indeed empty, flow continues to block 80 where a new reference point is generated. Flow then continues to decision block 260 where it is determined if all clauses are satisfied by the new reference point. If all clauses are satisfied flow continues to block 210 where it is reported that the formula is satisfiable.

Returning to decision block 260, if it is determined that all clauses are not satisfied, flow return to block 30 and a new iteration begins. Returning to decision block 200, if it determined that the second set of clauses is not empty, flow continues back to block 50 where a new decision assignment is made. Returning to decision block 140 if it determined that conflicting assignments exist, flow continues to block 170 where a conflict clause is generated. Flow then continues to decision block 180 where a determination is made as to whether the conflict clause is empty. If the clause is empty flow continues to block 190 where the formula is reported unsatisfiable. Returning to decision block 180 if the conflict clause is not empty flow continues to block 150 where at least one variable is unassigned. Flow then continues to block 160 where the second set of clauses is recomputed. Flow then continues back to block 50 where a new decision assignment is made.

Pseudo code implementing an exemplary method is provided below. One of ordinary skill in the art, given this disclosure will know how to implement these methods.
　　DMRP-SAT(F)
　　{p=gen_ref_point(F)
　　　　while (true)
　　　　　　{C=pick_clause(F,p);
　　　　　　lit=pick_lit(F,C,p);
　　　　　　(ans, y)=DMRP-solve(F, C, lit, p);
　　　　　　if(ans==unsat) return (unsat);
　　　　　　if(and==sat) return (sat);
　　　　　　if(ans==literal) continue;
　　　　　　if (ans==rec_sat)
　　　　　　　　{p=modify (p, y);
　　　　　　　　if(M(p)==ø) return (sat);}
　　　　　　if (ans==new_point)
　　　　　　　　p=modify(p,y);}}
　　DMRP-solve(F, C, lit, p)
　　{D(C,p,y)={C};
　　　while(true)
　　　{if C(C,p,y)==ø
　　　{restart(F);
　　　return(y, rec_sat);}
　　　make assignment(F, D,(C,p,y));
　　　ans=BCP(F, D(C,p,y),p);
　　　if (ans==sat) return (sat);
　　　if(ans==conflict)
　　　{C* gen_cnfl_clause(F);
　　　if(empty(C*) return (unsat);
　　　if(C*==unit) p=upd_pnt(p);
　　　if (C*==!lit)
　　　　{restart(F);
　　　　return (literal);}
　　　add_clause(F,C*);
　　　backtrack(F);}
　　　else continue; //no conflict
　　　if(num_of cnfl++>THRESH)
　　　{restart(F);
　　　return(y,new_point);}
　　　if(num_of cnfl>thresh)
　　　{restart(F);
　　　continue;}}}

Figure 5:
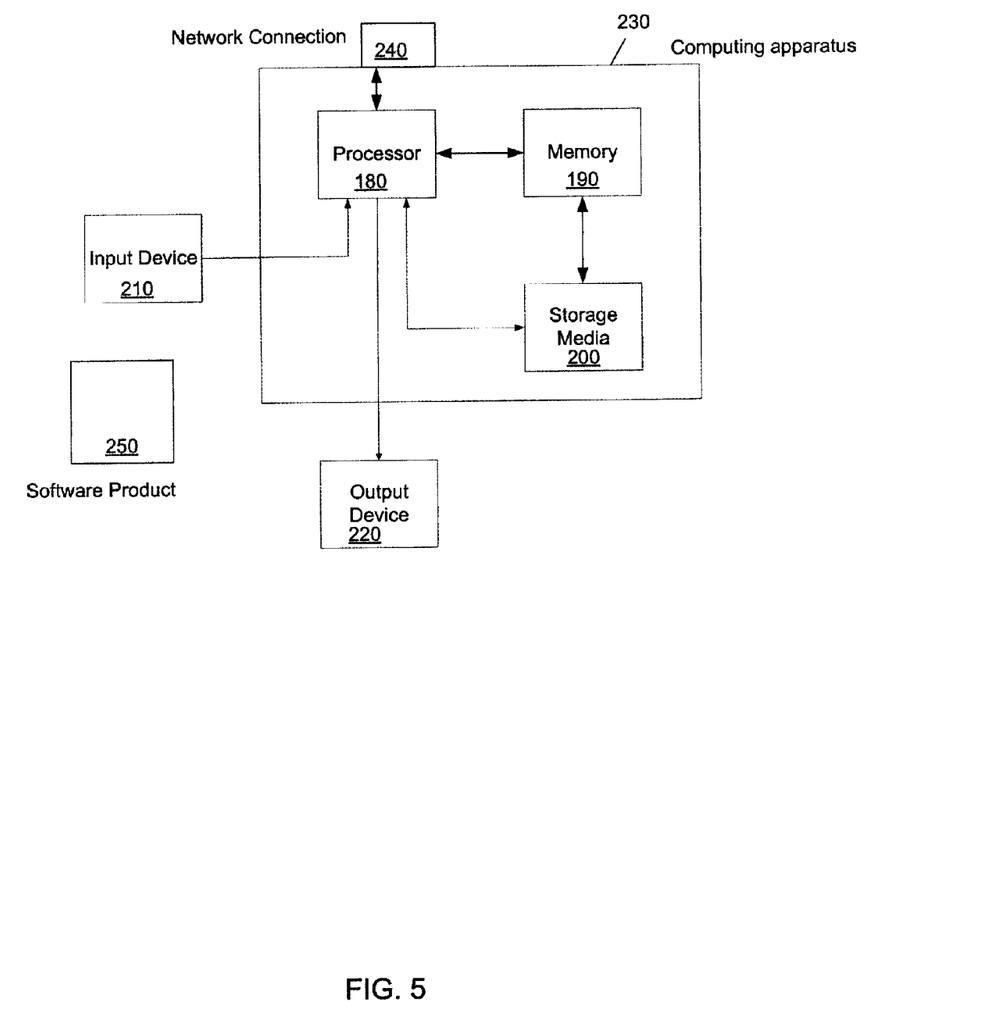
FIG. 5 illustrates a computing apparatus and software product consistent with provided embodiments.

An exemplary embodiment of a computing apparatus 230 and software product 250 are illustrated in FIG. 5. In these embodiments, computing apparatus contains processor 180, memory 190, storage media 200, input device 210, and output device 220. In an alternate embodiment, computing apparatus additionally includes network connection 240 configured to allow computing apparatus 230 to communicate to other computing apparatuses over a network (not shown). In one embodiment, storage media 200 contains a set of processor executable instructions that when executed by processor 180 configure computing apparatus 230 to generate a satisfiability report from a design problem by employing the above described methods. In another embodiment, input device 210 is a drive suitable for removable storage media, such as a CD or DVD ROM drive. In these embodiment, software product 250 is a suitable media which interoperates with input device 250. Contained on software product 250 is a set of processor executable instructions that, when executed by processor 180 configure computing apparatus 230 generate a satisfiability report by employing the provided methods. In another embodiment, software product 250 comprises a non-volatile memory, such as a hard drive or solid state drive, residing on another computing apparatus 230 across a network (not shown).

An exemplary programming language that the disclosed has been reduced to practice using is C++. Compilers are known in the art, a reduction to practice which yielded the below performance was compiled with gcc (version 3.2.2 compiler). The below benchmark results were produced on a computer equipped with Intel's XENON™ processor running at 3.06 GHz operating Linux operating system Experimental benchmark results of satisfiability problems solved with competing methods are illustrated in Table 1 below.

TABLE 1

Sample of BMC formulas

| Name | #vars ×10⁶ | #clauses ×10⁶ | BerkMin #cnfl ×10³ | BerkMin time (sec.) | Minisat #cnfl ×10³ | Minisat time (sec.) | DMRP-SAT #cnfl ×10³ | DMRP-SAT time (sec.) |
|---|---|---|---|---|---|---|---|---|
| sched | 1.0 | 2.7 | 24 | 386 | 23 | 1038 | 0.07 | 9 |
| byteen | 0.2 | 0.6 | 21 | 138 | 60 | 1074 | 8.8 | 309 |
| stimulus | 0.1 | 0.4 | 7.9 | 39 | 49 | 370 | 7.5 | 109 |
| ipt | 1.2 | 3.5 | 61 | 2896 | 108 | 3029 | 4.8 | 253 |
| iqm | 2.3 | 7.0 | 308 | 11704 | 732 | 16568 | 0.5 | 61 |
| prop3 | 1.4 | 4.3 | 822 | 5230 | 495 | 9084 | 77 | 3357 |
| gmtx | 2.7 | 7.9 | 12 | 281 | 47 | 2462 | 0.05 | 28 |
| sdl | 0.4 | 1.2 | 183 | 551 | 149 | 472 | 75 | 4279 |
| write | 0.6 | 1.8 | 8.4 | 168 | 48 | 552 | 1.2 | 70 |
| prop9 | 1.0 | 3.0 | 74 | 898 | 40 | 429 | 2.9 | 118 |
| Unsatisfiable Formulas | | | | | | | | |
| always | 0.2 | 0.8 | 19 | 45 | 21 | 213 | 5.0 | 63 |
| page | 0.2 | 0.8 | 19 | 35 | 19 | 151 | 14 | 763 |
| mcbdm | 0.3 | 0.8 | 17 | 144 | 6.2 | 84 | 1.5 | 43 |
| lddata | 0.2 | 0.5 | 20 | 31 | 55 | 666 | 18 | 336 |
| cmcnt | 1.2 | 3.6 | 8.5 | 491 | 2.5 | 68 | 3.0 | 184 |
| iwrk | 1.3 | 4.1 | 202 | 3934 | 31 | 447 | 6.5 | 172 |
| cho | 0.1 | 0.3 | 14 | 23 | 15 | 42 | 31 | 2661 |
| CCC | 0.3 | 1.1 | 38 | 199 | 22 | 165 | 23 | 2570 |

Statistics for recursively satisfied clauses are provided in Table 2 below.

TABLE 2

Statistics on Recursively Satisfied Clauses

| name | # confl | size of initial M(p) | # cases of rec. sat. a clause | # longest chain | Ily/IVars(F)l M(p) = 0 |
|---|---|---|---|---|---|
| sched | 67 | 1 | 1 | 1 | 18 |
| byteen | 8824 | 543 | 255 | 255 | 3.5 |
| stimulus | 7518 | 276 | 29 | 29 | 1.8 |
| data | 15521 | 1034 | 212 | 114 | 77 |
| ifreeq | 3426 | 615 | 438 | 438 | 1.9 |
| ipt | 4750 | 775 | 601 | 601 | 0.8 |
| prop3 | 77127 | 44 | 29 | 6 | 76 |
| muls | 556 | 104 | 69 | 69 | 1.4 |
| T1 | 64 | 2 | 1 | 1 | 67 |
| TX | 77934 | 8 | 7 | 2 | 96 |
| HP-4850 | 17932 | 62 | 8 | 7 | 1.0 |
| HP-974 | 2092 | 1 | 1 | 1 | 44 |
| write | 1175 | 149 | 87 | 84 | 0.9 |
| prop9 | 2892 | 1 | 1 | 1 | 31 |
| SUN-442 | 17 | 1 | 1 | 1 | 95 |
| SUN-443 | 2010 | 3999 | 2000 | 2000 | 1.6 |

Thus, it is seen that a method, computing apparatus and computer software product for providing satisfiability reports are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A method, implemented on a computer system having one or more processors, of producing a satisfiability report on a design problem comprising:
    (a) converting a design problem, into a conjunctive normal form formula to be solved;
    (b) generating a reference point from the design problem, the reference point comprising an assignment of values to all variables in the conjunctive normal form formula;
    (c) deriving, with one or more of the processors, a first set of clauses from the formula, the first set comprising the clauses that are falsified by the reference point;
    (d) forming, with one or more of the processors, a second set of clauses from the first set, the second set of clauses initially equal to a non-empty subset of clauses falsified by the reference point;
    (e) making a decision assignment satisfying at least one clause in the second set;
    (f) performing, with one or more of the processors, Boolean Constraint Propagation by making a plurality of implied assignments, each implied assignment satisfying a yet unsatisfied clause having only one unassigned literal;
    (g) recomputing, with one or more of the processors, the second set of clauses after each decision assignment and each implied assignment, the recomputing comprising
        (g)(1) removing, from the second set, a clause satisfied by the assignment;
        (g)(2) adding, to the second set, clauses unsatisfied by the new assignment, where the added clauses have a literal falsified by the new assignment and the new assignment disagrees with the reference point;
    (h) generating, with one or more of the processors, a new reference point when the second set of clauses is empty, the new reference point being obtained from the previous reference point by flipping all the assignments of the previous reference point that disagree with new assignments; and
    (i) reporting satisfiability of the formula if the new reference point satisfies all the clauses.

2. The method of claim 1, further comprising iteratively repeating (e), (f), and (g) until the second set of clauses is empty.

3. The method of claim 2, wherein a subsequent decision assignment is chosen to satisfy the largest number of clauses from the second set of clauses.

4. The method of claim 2, further comprising unassigning at least one previously made assignment if a predetermined condition is met.

5. The method of claim 4, wherein the condition to be met is the existence of conflicting assignments to a variable derived during Boolean Constraint Propagation.

6. The method of claim 4, further comprising recomputing the second set of clauses each time a variable is unassigned, the recomputing comprising
    returning to the second set of clauses a clause that was removed from the second set because it was satisfied by an assignment to this variable; and
    removing from the second set of clauses a clause that was added to the second set because an assignment to this variable satisfied the condition (g2).

7. The method of claim 6, further comprising learning a conflict clause when conflicting assignments to a variable are derived during Boolean Constraint Propagation.

8. The method of claim 7, wherein the learned conflict clause is added to the second set of clauses when it meets the condition in (g)(2).

9. The method of claim 7, where the conjunctive normal form formula is reported unsatisfiable if any empty conflict clause is learned.

10. The method of claim 7, wherein the next decision assignment is made to a literal of a conflict clause that is currently in the second set of clauses.

11. A Computing apparatus comprising:
a processor;
a memory, in communication with the processor and further in communication with a non-transitory storage media, the storage media comprising a set of processor executable instructions sufficient that, when executed by the processor configure the computing apparatus to produce a satisfiability report on a design problem, the configuration comprising a configuration to:
(a) convert the design problem, into a conjunctive normal form formula to be solved;
(b) generate a reference point from the design problem, the reference point comprising an assignment of values to all variables in the conjunctive normal form formula;
(c) derive a first set of clauses from the formula, the first set comprising the clauses that are falsified by the reference point;
(d) form a second set of clauses from the first set, the second set of clauses initially equal to a non-empty subset of clauses falsified by the reference point;
(e) make a decision assignment satisfying at least one clause in the second set;
(f) perform Boolean Constraint Propagation by making a plurality of implied assignments, each implied assignment satisfying a yet unsatisfied clause having only one unassigned literal;
(g) recomputed the second set of clauses after each decision assignment and each implied assignment, the recomputing comprising
(g)(1) remove, from the second set, a clause satisfied by the assignment;
(g)(2) add, to the second set, clauses unsatisfied by the new assignment, where the added clauses have a literal falsified by the new assignment and the new assignment disagrees with the reference point;
(h) generate a new reference point when the second set of clauses is empty, the new reference point being obtained from the previous reference point by flipping all the assignments of the previous reference point that disagree with new assignments; and
(i) report satisfiability of the formula if the new reference point satisfies all the clauses.

12. The computing apparatus of claim 11, wherein the configuration further comprises a configuration to iteratively repeat (e), (f), and (g) until the second set of clauses is empty.

13. The computing apparatus of claim 12, wherein the configuration further comprises a configuration to choose the next decision assignment to satisfy the largest number of clauses from the second set of clauses.

14. The computing apparatus of claim 12, wherein the configuration further comprises a configuration to unassign at least one previously made assignment if a predetermined condition is met.

15. The computing apparatus of claim 14, wherein the condition to be met is an existence of conflicting assignments to a variable derived during Boolean Constraint Propagation.

16. The computing apparatus of claim 14, wherein the configuration further comprises a configuration to recomputed the second set of clauses each time a variable is unassigned, the configuration to recomputed comprising a configuration to return to the second set of clauses a clause that was removed from the second set because it was satisfied by an assignment to this variable; and
remove from the second set of clauses a clause that was added to the second set because an assignment to this variable satisfied the condition (g2).

17. The computing apparatus of claim 16, wherein the configuration further comprises a configuration to learn a conflict clause when conflicting assignments to a variable are derived during Boolean Constraint Propagation.

18. The computing apparatus of claim 17, wherein the configuration further comprises a configuration to add the learned conflict clause to the second set of clauses when it meets the condition in (g)(2).

19. The computing apparatus of claim 17, wherein the configuration further comprises a configuration to report the conjunctive normal form formula as unsatisfiable if an empty conflict clause is learned.

20. The computing apparatus of claim 17, wherein the configuration further comprises a configuration to make a next decision assignment to a literal of a conflict clause that is currently in the second set of clauses.

21. A computer software product comprising:
a non-transitory computer readable medium, the computer readable medium comprising a set of processor executable instructions that, when executed by a processor configure a computing apparatus to generate a satisfiability report from a design problem, the configuration comprising a configuration to:
(a) convert the design problem, into a conjunctive normal form formula to be solved;
(b) generate a reference point from the design problem, the reference point comprising an assignment of values to all variables in the conjunctive normal form formula;
(c) derive a first set clauses from the formula, the first set comprising the clauses that are falsified by the reference point;
(d) form a second set of clauses from the first set, the second set of clauses initially equal to a non-empty subset of clauses falsified by the reference point;
(e) make a decision assignment satisfying at least one clause in the second set;
(f) perform Boolean Constraint Propagation by making a plurality of implied assignments, each implied assignment satisfying a yet unsatisfied clause having only one unassigned literal;
(g) recomputed the second set of clauses after each decision assignment and each implied assignment, the recomputing comprising
(g)(1) remove, from the second set, a clause satisfied by the assignment;
(g)(2) add, to the second set, clauses unsatisfied by the new assignment, where the added clauses have a literal falsified by the new assignment and the new assignment disagrees with the reference point;
(h) generate a new reference point when the second set of clauses is empty, the new reference point being obtained from the previous reference point by flipping all the assignments of the previous reference point that disagree with new assignments; and
(i) report satisfiability of the formula if the new reference point satisfies all the clauses.

* * * * *